(12) United States Patent
Worley et al.

(10) Patent No.: US 6,525,267 B1
(45) Date of Patent: Feb. 25, 2003

(54) WRAPPED MULTIPLE DENSITY GASKET

(75) Inventors: Richard Worley, Cedar Park, TX (US); Chase Berry, Leander, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 10/171,962

(22) Filed: Jun. 14, 2002

(51) Int. Cl.$^7$ ................................................. H05K 9/00
(52) U.S. Cl. ................... 174/35 GC; 361/816; 361/799; 361/753; 361/818
(58) Field of Search ................... 361/816, 818, 361/800, 799, 753, 801, 726, 740, 741, 747, 759, 802; 174/35 R, 35 GC, 35 MS; 211/41.17, 26.2; 428/36.3, 36.5, 36.8, 36.9, 148, 141, 143; 277/920, 653, 944, 936, 630, 639, 650, 651, 649; 439/86, 92, 89, 609, 927

(56) References Cited

U.S. PATENT DOCUMENTS

| | | | | |
|---|---|---|---|---|
| 4,857,668 A | * | 8/1989 | Buonanno | 174/35 GC |
| 4,977,296 A | * | 12/1990 | Hemming | 174/35 MS |
| 5,045,635 A | * | 9/1991 | Kaplo et al. | 174/34 GC |
| 5,115,104 A | * | 5/1992 | Bunyan | 174/35 GC |
| 5,142,101 A | * | 8/1992 | Matsuzaki et al. | 174/35 GC |
| 5,194,691 A | * | 3/1993 | McIlwraith | 174/35 GC |
| 5,205,751 A | * | 4/1993 | Schwartz et al. | 439/86 |
| 5,347,430 A | | 9/1994 | Curlee et al. | |
| 5,578,790 A | * | 11/1996 | Peregrim | 174/35 GC |
| 5,661,640 A | | 8/1997 | Mills et al. | |
| 5,712,449 A | * | 1/1998 | Miska et al. | 174/35 GC |
| 5,804,762 A | * | 9/1998 | Jones et al. | 174/35 GC |
| 6,054,005 A | * | 4/2000 | Hurley et al. | 156/219 |
| 6,111,746 A | | 8/2000 | Wahl et al. | |
| 6,121,545 A | * | 9/2000 | Peng et al. | 174/35 GC |
| 6,122,167 A | | 9/2000 | Smith et al. | |
| 6,173,970 B1 | * | 1/2001 | Choudary et al. | 277/644 |

* cited by examiner

Primary Examiner—David Martin
Assistant Examiner—Phuong T. Vu
(74) Attorney, Agent, or Firm—Haynes and Boone, LLP

(57) ABSTRACT

A chassis discontinuity seal includes a gasket member comprising a compressible material with an interruption on its peripheral surface and a flexible sealing material spanning the interruption. The gasket member is placed on a first surface for sealing engagement with a mating closure surface. The compressible material has a first density and the interruption defines an elongated portion of the gasket having a second density, less than the first density. The gasket may be used in any shielding enclosure where it is desirable to reduce the compression force while maintaining high surface conductivity.

20 Claims, 6 Drawing Sheets

WRAPPED MULTIPLE DENSITY GASKET

BACKGROUND

The disclosures herein relate generally to computer systems and more particularly to sealing chassis enclosures used in such systems.

As the value and use of information continue to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Because of the lack of precision in many of today's high production manufacturing processes, mechanical parts designed to contact each other may not attain sufficient contact. Sufficient contact between the parts is necessary to simulate a homogeneous material or surface. This homogeneous surface allows the current to flow freely along the surface.

Electromagnetic fields inside the chassis or shielding case produce a current along the inside of the chassis. Emissions from the chassis occur when a current in the chassis passes over a discontinuity. A discontinuity may exist at a joint between two elements which do not have a tight, metal-to-metal (electrically conductive) seal. As the current attempts to travel around the discontinuity it produces a voltage across the discontinuity on the inside of the chassis that is also seen across the discontinuity on the outside of the chassis. The voltage on the outside of the chassis induces a current on the outside of the chassis that results in an electromagnetic field radiating outside of the chassis. This presents a problem of producing electromagnetic interference (EMI) between this component and others.

One method of addressing this problem in the past has been to insert an EMI gasket between the two conducting surfaces. The gasket interior may be composed of any of a number of compressible materials, and the gasket exterior is a layer of conductive material. As the two conducting surfaces come together, the surfaces compress the interior of the gasket, resulting in a conductive contact between the two surfaces through the conductive surface layer of the gasket. A problem with this solution involves the degree of contact that is created between the gasket and the surface. A certain level of compression force provided by the conducting surfaces is required to obtain reasonable and reliable gasket conductivity performance. Flat, square, D-shaped, or round-gaskets often do not create enough surface contact between a conducting surface and the gasket, and require increased compression forces in order to provide chassis closure that results in cosmetic distortion of the chassis. Typical industry design practice is to provide a groove in the chassis or shielding case to contain the gasket with a mating adjacent surface tongue applying closure force. The gasket normally is sized to be retained in the grove without adhesive. The applied compression force of the tongue expands the gasket to make contact with the bottom and sides of the groove as well as the tongue. The amount of force required closing the chassis or shielding case is influenced by the gasket design and selected materials.

Therefore, what is needed is a gasket that will increase conductivity at a reduced deflection force to provide easier chassis closure with less cosmetic distortion, and more efficient EMI shielding.

SUMMARY

One embodiment, accordingly, provides a chassis discontinuity seal that includes a gasket member comprising an elongated compressible material having a first density and including a peripheral surface. The peripheral surface has an interruption which defines an elongated portion of the gasket of a second density, less than the first density. A flexible sealing material covers the peripheral surface and spans the elongated portion of the gasket.

A principal advantage of these embodiments is that the gasket member enhances EMI containment by providing increased surface contact between the gasket and the two surfaces while requiring a low force to seal the two surfaces. The embodiments are also applicable to any shielding enclosure desiring to reduce compression force while maintaining high surface conductivity.

DETAILED DESCRIPTION

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
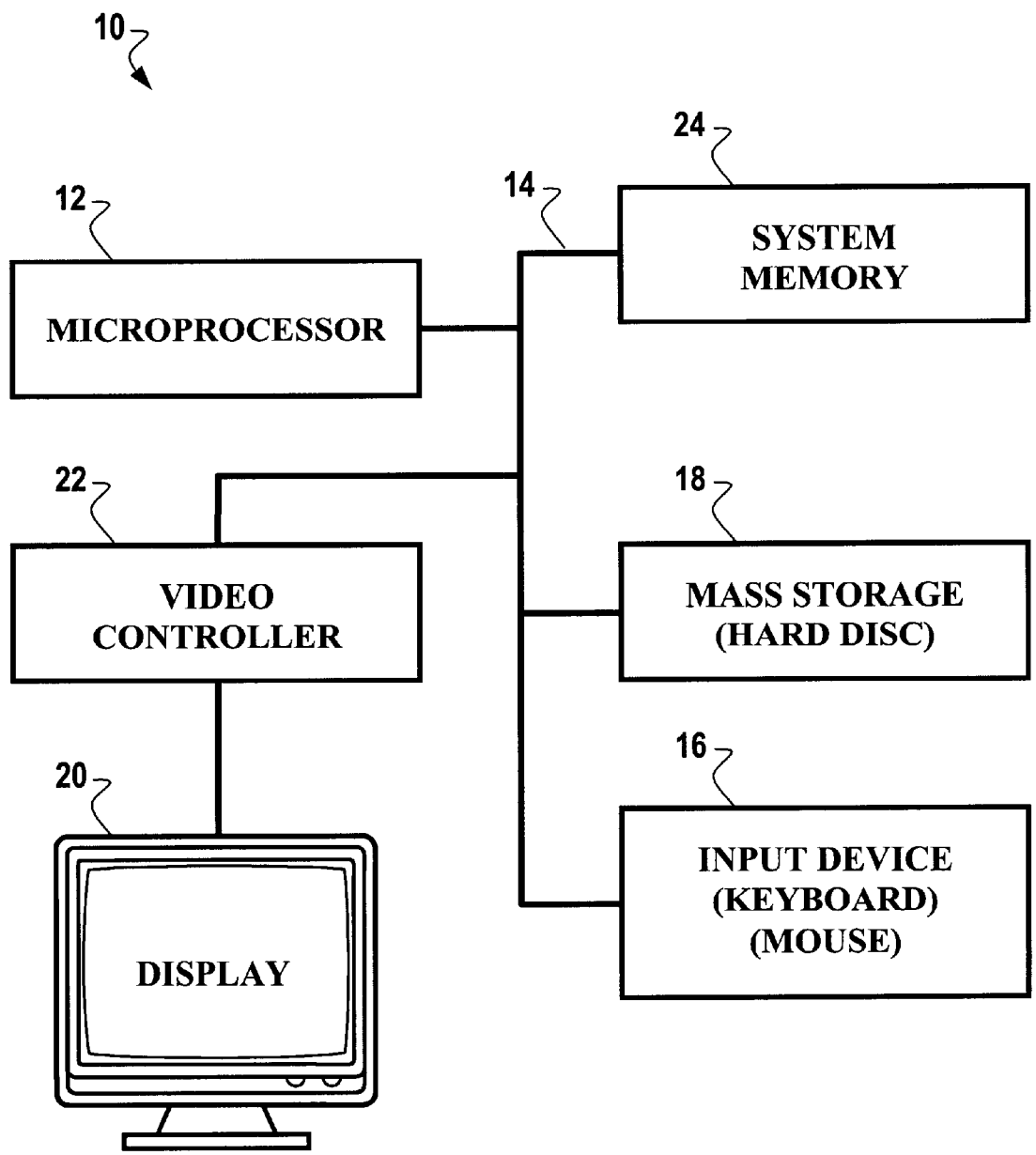
FIG. 1 is a diagrammatic view illustrating an embodiment of an information handling system.

In one embodiment, computer system 10, FIG. 1, includes a microprocessor 12, which is connected to a bus 14. Bus 14 serves as a connection between microprocessor 12 and other components of computer system 10. An input device 16 is coupled to microprocessor 12 to provide input to microprocessor 12. Examples of input devices include keyboards, touchscreens, and pointing devices such as mouses, trackballs and trackpads. Programs and data are stored on a mass storage device 18, which is coupled to microprocessor 12. Mass storage devices include such devices as hard disks, optical disks, magneto-optical drives, floppy drives and the like. Computer system 10 further includes a display 20, which is coupled to microprocessor 12 by a video controller 22. A system memory 24 is coupled to microprocessor 12 to provide the microprocessor with fast storage to facilitate execution of computer programs by microprocessor 12. It should be understood that other busses and intermediate circuits can be deployed between the components described above and microprocessor 12 to facilitate interconnection between the components and the microprocessor.

Figure 2:
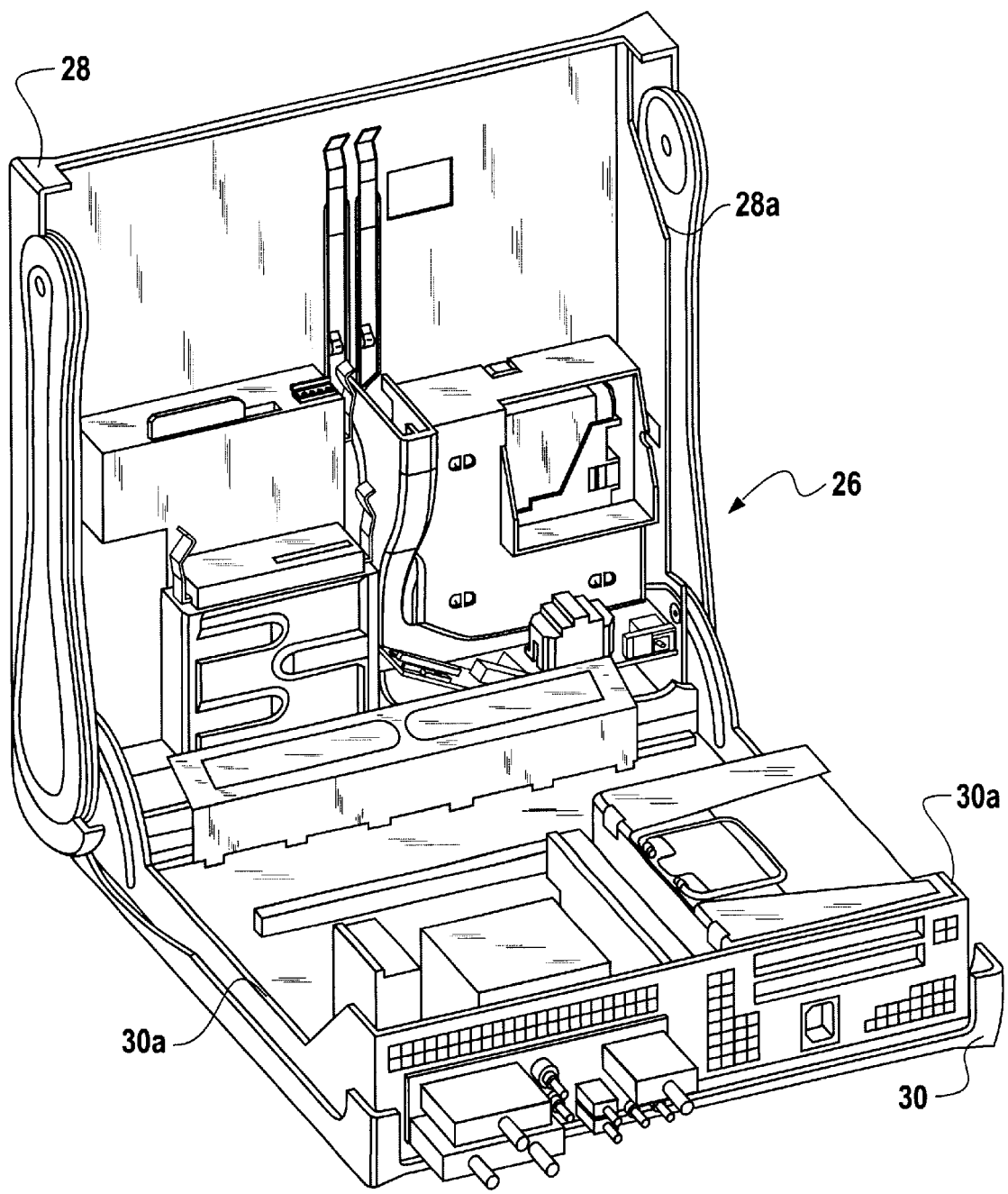
FIG. 2. is a perspective view illustrating an embodiment of a chassis for use with the system of FIG. 1.

A chassis 26, FIG. 2, for at least a portion of the system 10 includes a first chassis portion 28 and a second chassis portion 30. Chassis portion 28 closes with chassis portion 30 to form an enclosure. The chassis portions 28 and 30 include mating closure surfaces 28a and 30a, respectively, see also, FIG. 3.

Figure 4:
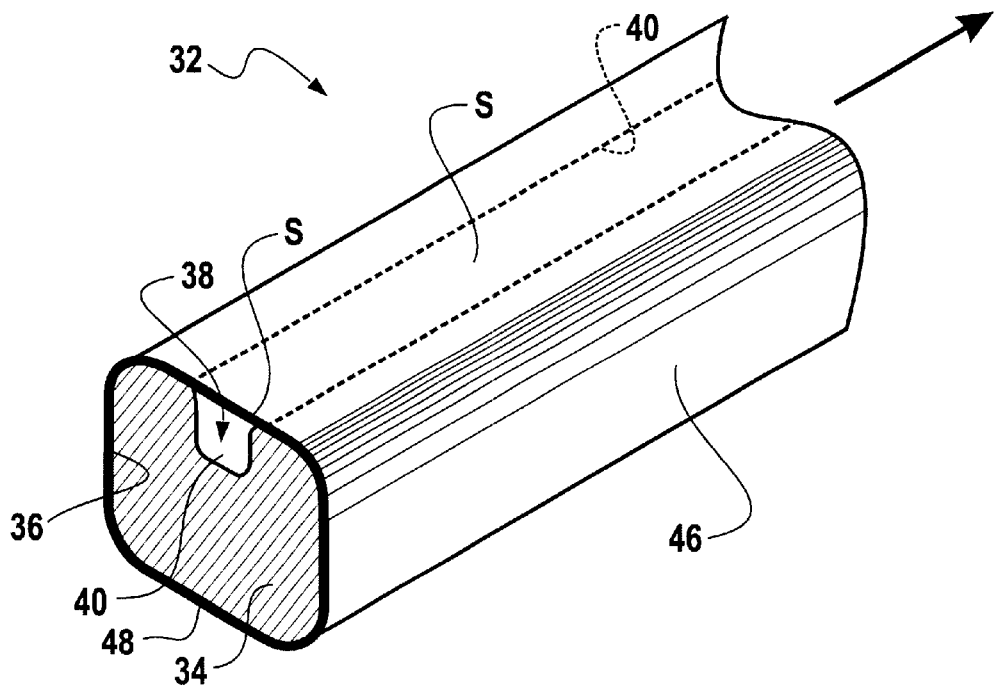
FIG. 4 is a perspective view illustrating an embodiment of a gasket member.
Figure 5:
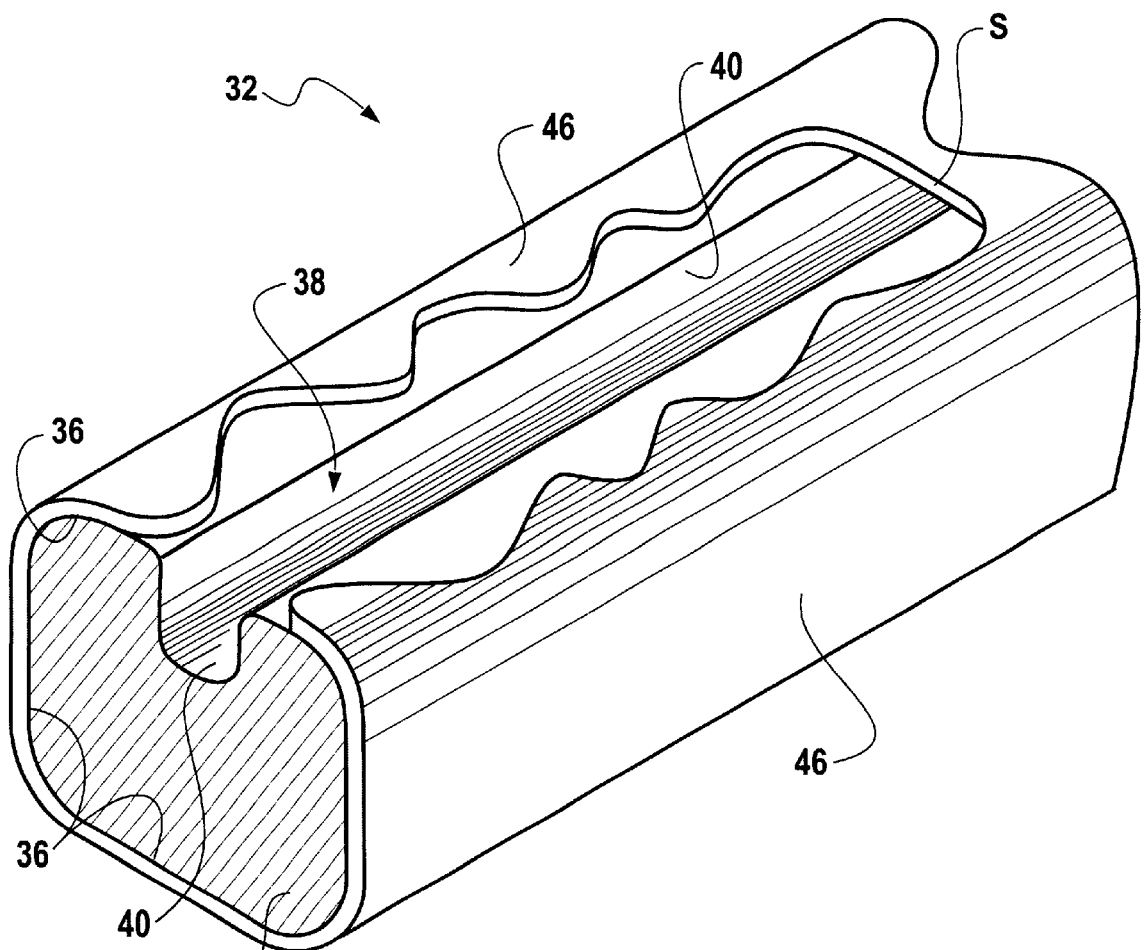
FIG. 5 is a perspective view illustrating an embodiment of the gasket member with a covering of flexible sealing material cut away to show an interruption as an elongated groove.

A gasket 32, FIGS. 4 and 5, is formed of an elongated member of compressible material 34 which has a first density. The preferred material is TPE Foam (a foam type material which is commercially available). The gasket material 34 includes a peripheral surface 36, a portion of which includes an interruption 38 which defines an elongated portion of gasket 32. The interruption 38 may be provided in various forms, (discussed below) each form having a second density which is less than the first density.

Figure 6:
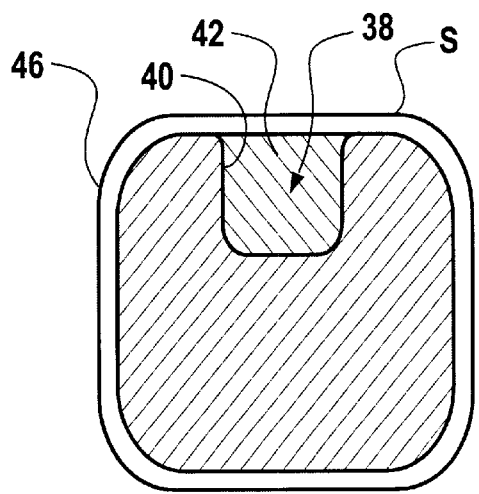
FIG. 6 is a cross sectional view illustrating an embodiment of the gasket member with the interruption comprising an elongated groove with a filler material therein.
Figure 7:
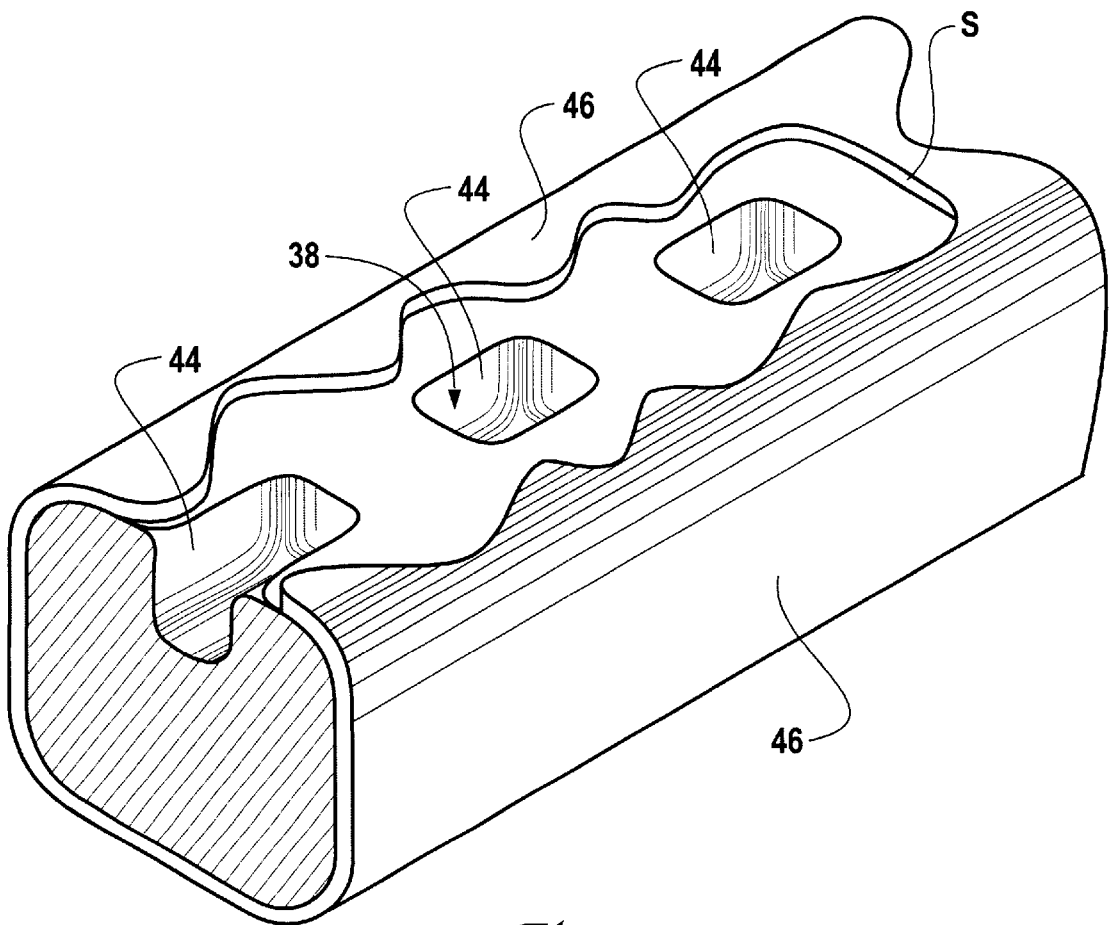
FIG. 7 is a perspective view illustrating an embodiment of the gasket member with the flexible sealing material cut away to show the interruption as a series of voids formed in the gasket.
Figure 8:
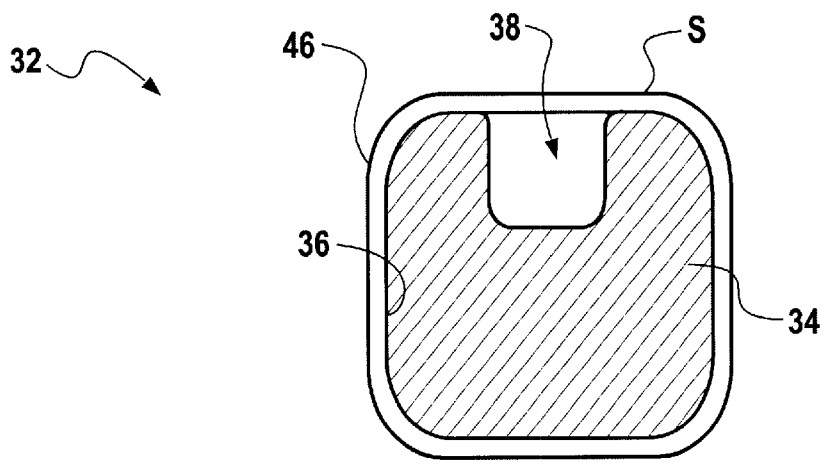
FIG. 8 is a cross sectional view illustrating an embodiment of the gasket member with the compressible material that is U-shaped in cross section.
Figure 9:
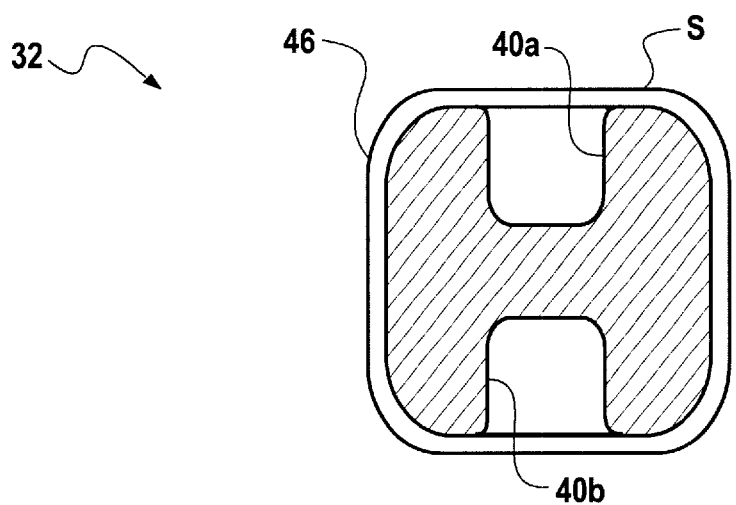
FIG. 9 is a cross sectional view illustrating an embodiment of the gasket member with the compressible material that is H-shaped in cross section.

For example, the interruption 38 may be in the form of an elongated groove 40, FIGS. 4 and 5, the groove 40 having a compressible filler material 42 therein, FIG. 6, which is a less dense foam material than the material 34, or a plurality of voids 44, FIG. 7. In the case of groove 40, FIGS. 4 and 5, and voids 44, FIG. 7, there is no filler and therefore the interruption 38 is substantially less dense than the material 34, i.e., the density of air. Also, as illustrated in FIG. 8, the gasket 32 is U-shaped in cross-section, whereas in FIG. 9, the gasket 32 is H-shaped in cross-section and includes a pair of opposed grooves 40a and 40b.

A flexible sealing material 46, FIGS. 4–6, includes a portion which covers the peripheral surface 36 of gasket 32 and, rather than following the contour of the interruption 38, the material 46 includes a portion which spans the interruption 38 at S, i.e., groove 40, groove 40 including filler 42, and voids 44. The material 46 is preferably metalized Ni/Cu, Tin/Cu, and silver woven or non-woven textile which is commercially available and is an electrically conductive material. A portion 48, FIG. 4, of the flexible sealing material 46 includes an adhesive for securing the gasket 32 to a supporting surface.

Figure 3:
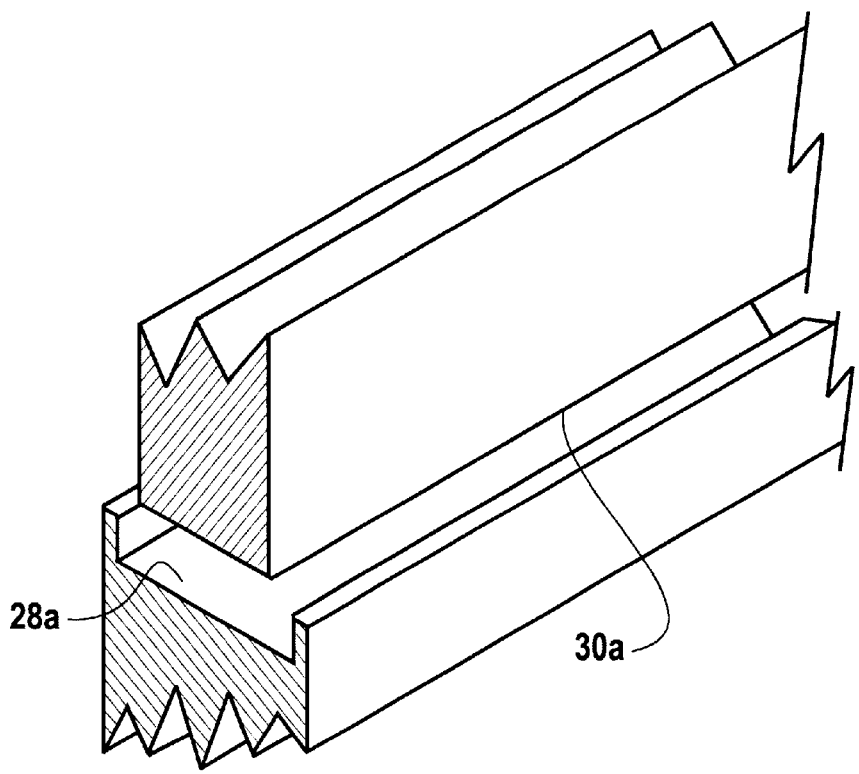
FIG. 3 is a partial perspective view illustrating an embodiment of mating closure surfaces of the chassis.
Figure 10:
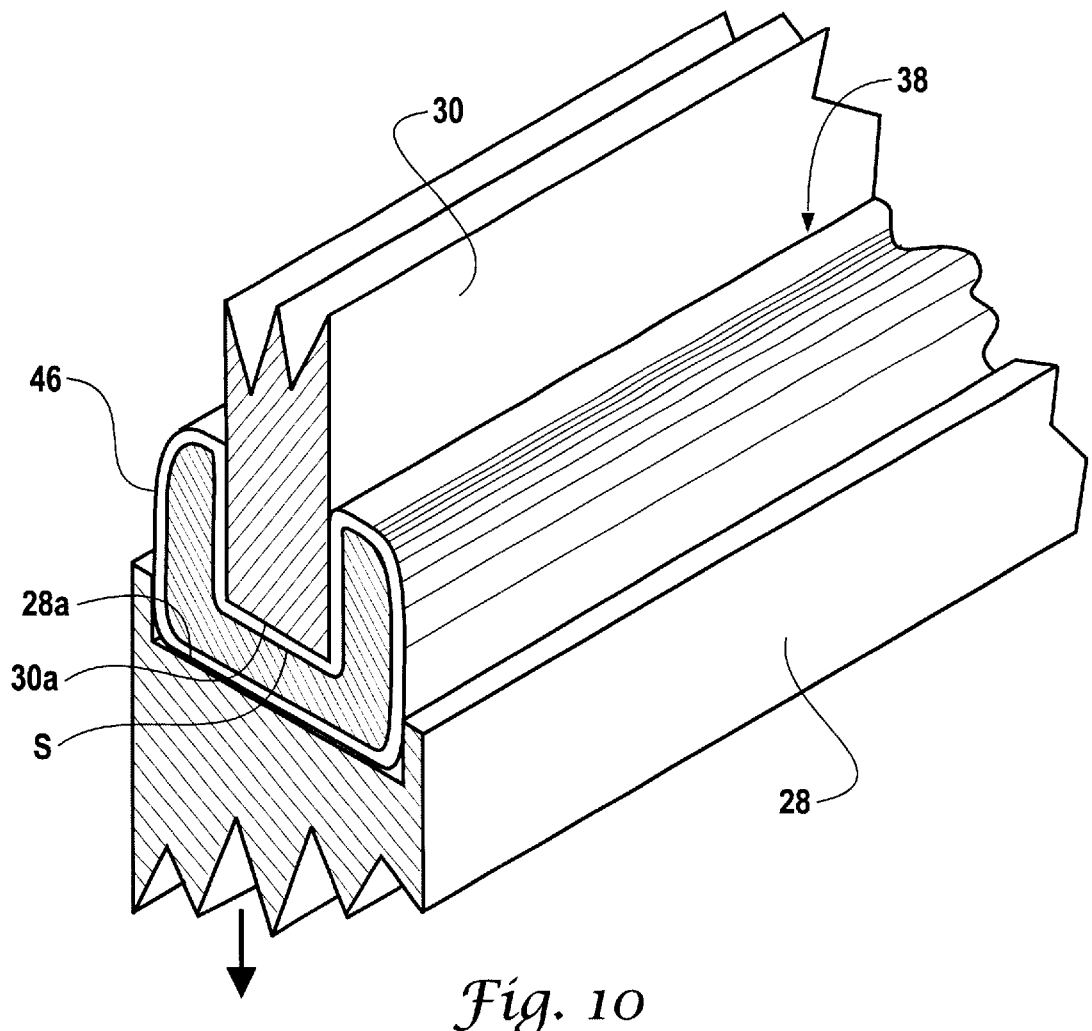
FIG. 10 is a perspective view illustrating an embodiment of the gasket member in sealing engagement with two surfaces.

In operation, gasket 32 seats on a closure surface 28a, FIG. 3, of chassis portion 28. When the closure portions 28 and 30 are moved to a closed position, FIG. 10, closure surface 30a seats against the span S adjacent the elongated interruption 38 and, due to the lower density of the interruption, the closure surface 30a urges the flexible sealing material 46 into the interruption 38 which draws the flexible sealing material 46 into sealing engagement with a large area of the closure portion 30 including the closure surface 30a.

Although illustrative embodiments have been shown and described, a wide range of modification, change and substitution is contemplated in the foregoing disclosure and in some instances, some features of the embodiment may be employed without a corresponding use of other features. Accordingly, it is appropriate that the appended claims be construed broadly and in a manner consistent with the scope of the embodiments disclosed herein.

What is claimed is:

1. A gasket member comprising:
    an elongated compressible material having a first density and including a peripheral surface, the peripheral surface having an interruption therein which defines an elongated portion of the gasket of a second density, less than the first density; and
    a flexible sealing material, a first portion of the flexible sealing material covering the peripheral surface and a second portion of the flexible sealing material spanning the interruption of the gasket.

2. The gasket member of claim 1, wherein the interruption comprises an elongated groove.

3. The gasket member of claim 1, wherein the interruption comprises an elongated groove having a filler therein, the filler being a material of the second density.

4. The gasket member of claim 1, wherein the interruption comprises a plurality of voids formed in the gasket.

5. The gasket member of claim 1, wherein the flexible sealing material is an EMI shield comprising a conductive material.

6. The gasket member of claim 1, wherein the compressible material is U-shaped in cross section.

7. The gasket member of claim 1, wherein the compressible material is H-shaped in cross section.

8. The gasket member of claim 1, wherein the first portion of the flexible sealing material covering the peripheral surface includes an adhesive for securing the gasket member to a supporting surface.

9. An information handling system comprising:
    a chassis including mating closure surfaces;
    a microprocessor mounted in the chassis;
    a storage coupled to the microprocessor;
    a gasket member mounted on one of the closure surfaces, the gasket member comprising an elongated compressible material having a first density and including a peripheral surface, the peripheral surface having an interruption therein which defines an elongated portion of the gasket of a second density, less than the first density; and a flexible sealing material, a first portion of the flexible sealing material covering the peripheral surface of the gasket member and a second portion of the flexible sealing material spanning the interruption of the gasket.

10. The system of claim 9, wherein the interruption comprises an elongated groove.

11. The system of claim 9, wherein the interruption comprises an elongated groove having a filler therein, the filler being a material of the second density.

12. The system of claim 9, wherein the interruption comprises a plurality of voids formed in the gasket.

13. The system of claim 9, wherein the flexible sealing material is an EMI shield comprising a conductive material.

14. The system of claim 9, wherein the compressible material is U-shaped in cross section.

15. The system of claim 9, wherein the compressible material is H-shaped in cross section.

16. The system of claim 9, wherein the first portion of the flexible sealing material covering the peripheral surface includes an adhesive for securing the gasket member to the one closure surface.

17. A method of sealing a discontinuity in a chassis comprising:

provide a chassis comprising a plurality of surfaces;

providing a gasket member comprising an elongated compressible material having a first density and including a peripheral surface, the peripheral surface having an interruption therein which defines an elongated portion of the gasket of a second density, less than the first density;

providing a flexible sealing material, a first portion of the flexible sealing material covering the peripheral surface of the gasket member and a second portion of the flexible sealing material spanning the interruption of the gasket;

placing the gasket member on a first one of the surfaces; and sealing a second surface with the first surface by compressing the gasket member between the first and second surfaces.

18. The method of claim 17, further comprising:

providing the compressible material with a U-shaped cross-section.

19. The gasket member of claim 17, further comprising:

providing the compressible material with an H-shaped cross-section.

20. The gasket member of claim 17, further comprising:

providing an adhesive on the first portion of the flexible sealing material.

* * * * *